United States Patent [19]

Lowrey

[11] Patent Number: 5,217,830
[45] Date of Patent: Jun. 8, 1993

[54] METHOD OF FABRICATING PHASE SHIFTING RETICLES USING ION IMPLANTATION

[75] Inventor: Tyler Lowrey, Boise, Id.
[73] Assignee: Micron Technology, Inc., Boise, Id.
[21] Appl. No.: 676,939
[22] Filed: Mar. 26, 1991
[51] Int. Cl.[5] .............................................. G03F 9/00
[52] U.S. Cl. ........................................ 430/5; 430/22; 430/311; 430/396
[58] Field of Search ................ 430/5, 22, 269, 311, 430/396

[56] References Cited

U.S. PATENT DOCUMENTS

| | | | |
|---|---|---|---|
| 3,604,778 | 9/1971 | Burckhardt | 350/3.5 |
| 4,360,586 | 11/1982 | Flanders et al. | 430/321 |
| 4,686,162 | 8/1987 | Stangl et al. | 430/5 |
| 4,902,899 | 2/1990 | Lin et al. | 250/492.1 |
| 5,045,417 | 9/1991 | Okamoto | 430/22 |

OTHER PUBLICATIONS

Durnin, et al., "Diffraction-Free Beams" Physical Review Letters, vol. 58 (Apr. 13, 1987), p. 1499.
Yamanaka, et al., "A 5.9 μm² Super Low Powder SRAM Cell Using a New Phase-Shift Lithography" IEDM 90 (Apr. 1990), p. 477.
Watanabe, et al., "Transparent Phase Shifting Mask", IEDM 90 (Apr. 1990), p. 821.
Terasawa, et al., "0.3-micron optical lithography using a phase-shifting mask", SPIE vol. 1088 Optical/Laser Microlithography II (1989), p. 25.
Nitayama, et al., "New Phase Shifting Mask with Self-aligned Phase Shifters for a Quarter Micron Photolithograph", IEDM 89 (Jul. 1989), p. 57.
Levenson, et al., "The Phase-Shifting Mask II: Imaging Simulations and Submicrometer Resist Exposures", IEEE Transactions on Electron Devices, vol. ED-31, No. 6 (Jun. 1984), p. 753.
Lin, Burn J., "Phase Shifting and Other Challeges in Optical Mask Technology", IBM-EF-15 (Sep. 26, 1990).
Hanyu, et al., "New phase-shifting mask with highly transparent SiO₂ phase shifters", SPIE vol. 1264 Optical/Laser Microlithography III (1990), p. 167.
Pfau, et al., "Exploration of fabrication techniques for phase shifting masks", Semiconductor Research Corporation (Sep. 11, 1990).
Neureuther, Andrew R., "Modeling Phase Shifting Masks", BASCUS Symposium (Sep. 26, 1990).
Fukuda, et al., "Phase-Shifting Mask and FLEX method for Advanced Photolithography", SPIE vol. 1264 Optical/Laser Microlithography III (1990), p. 14.
"LSI Process Lithography, Reticle, Stepper, DRAM", Nikkei Microdevice (Jul. 1990).
"64 M", Nikkei Microdevice (Jul. 1990).
Ku, et al., "Use of a π-Phase-Shifting X-Ray mask to Increase the Intensity Slope at Feature Edges", Semiconductor Research Corporation (Jun. 23, 1987).
Nakagawa, et al., "Fabrication of 64M DRAM with i-Line Phase-Shift Lithography", IEDM 90 (Apr. 1990), p. 817.

(List continued on next page.)

Primary Examiner—Marion E. McCamish
Assistant Examiner—S. Rosasco
Attorney, Agent, or Firm—Stephen A. Gratton

[57] ABSTRACT

A method of fabricating a phase shifting reticle that can be used as a mask in photolithographic processes such as semiconductor wafer patterning. A transparent quartz substrate is first coated with a patterned resist. The quartz substrate is then subjected to high voltage ion bombardment to produce a pattern of ion implant areas on the substrate. The ion implantation is closely controlled to produce areas on the substrate having an index of refraction different than the quartz substrate and selected to achieve a 180° phase shift. An opaque film is then deposited over the substrate and patterned with openings. This produces a repetitive pattern of alternating light transmission openings and phase shifters having opaque light blockers on either side.

20 Claims, 2 Drawing Sheets

OTHER PUBLICATIONS

Levenson, Marc D., "What is a Phase-Shifting Mask?", IBM Research Report (Aug. 15, 1990).

Prouty, et al., "Optical Imaging with Phase Shift Masks", Technology Transfer #90080327A-MIN, p. 41.

"Second Phase Shift Mask Workshop", Japanese Patent Applications, SEMATECH, Technology Transfer #90100345A-MIN, p. 159.

Levenson, et al., "Improving Resolution in Photolithography with a Phase-Shifting Mask", IEEE Transactions on Electron Devices, vol. ED-29, No. 12 (Dec. 1982), p. 1828.

Terasawa, et al., "Improved resolution of an i-line stepper using a phase-shifting mask", J. Vac. Sci. Technol. B., vol. 8, No. 6 (Nov./Dec. 1990), p. 1300.

Jinbo, et al., "0.2 $\mu$m or Less i-Line lithography by Phase-Shifting-Mask Technology", IEDM 90 (Apr. 1990), p. 825.

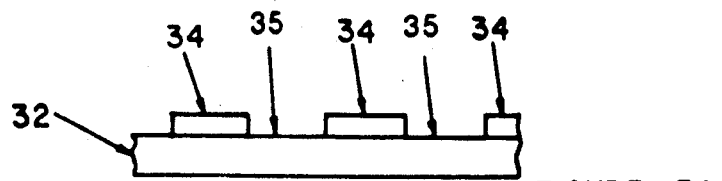
FIGURE 3A
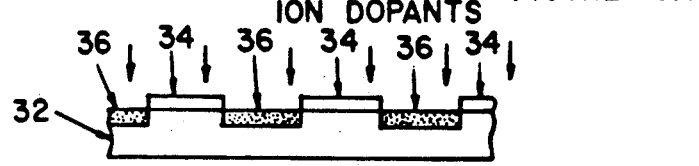
FIGURE 3B
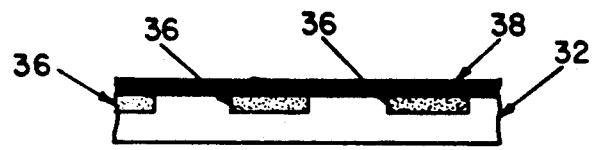
FIGURE 3C
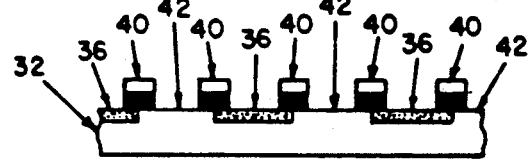
FIGURE 3D
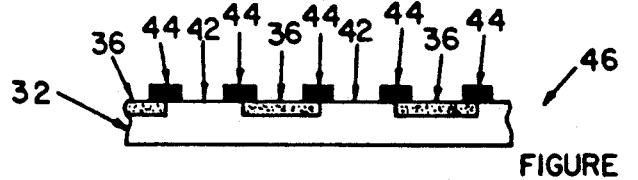
FIGURE 3E
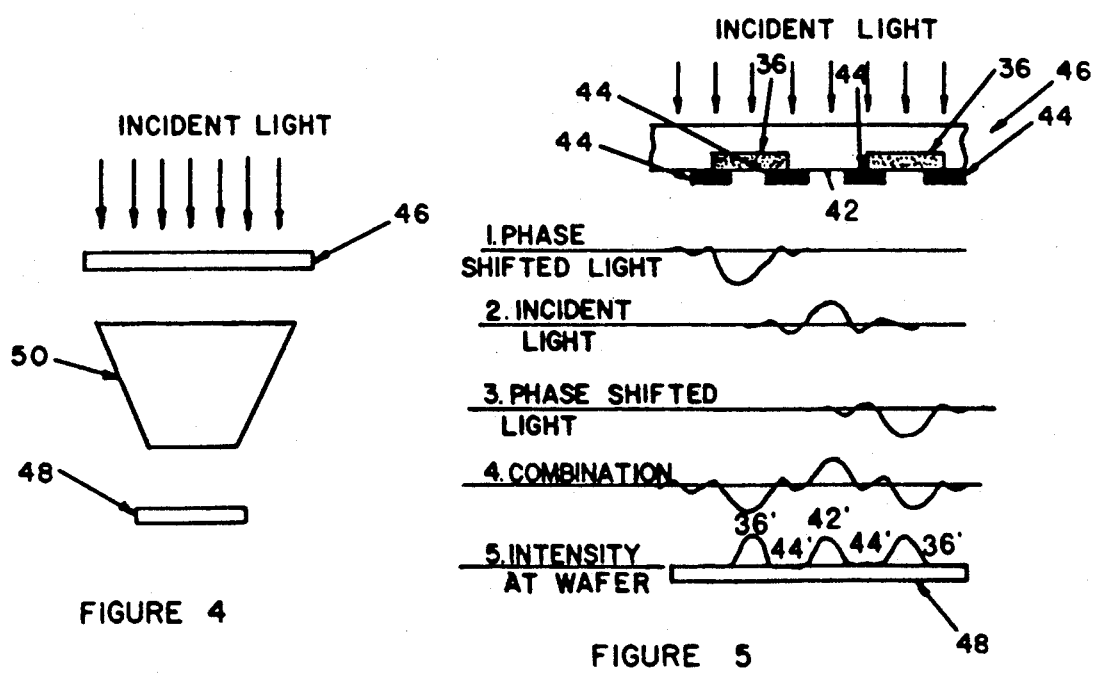
FIGURE 4
FIGURE 5

METHOD OF FABRICATING PHASE SHIFTING RETICLES USING ION IMPLANTATION

FIELD OF THE INVENTION

This invention relates to semiconductor manufacture and more particularly to a novel process particularly suited to fabricating phase shifting reticles or masks that can be used in fine-line photolithography.

BACKGROUND OF THE INVENTION

As semiconductor manufacturing advances to ultra-large scale integration (ULSI), the devices on semiconductor wafers shrink to sub-micron dimension and the circuit density increases to several million transistors per die. In order to accomplish this high device packing density, smaller and smaller feature sizes are required. This may include the width and spacing of interconnecting lines and the surface geometry such as corners and edges, of various features.

The requirement of small feature sizes with close spacing between adjacent features requires high resolution photolithographic processes. In general, photolithography utilizes a beam of light, such as UV waves, to transfer a pattern from a photolithographic mask onto a photoresist coating through an imaging lens. The mask includes opaque and transparent parent regions such that the shapes match those of the openings in the resist coating in the desired or predetermined pattern.

One technique currently being investigated for improving the resolution of the photolithographic process is known as phase shift lithography. With phase shift lithography the interference of light rays is used to overcome diffraction and improve the resolution and depth of optical images projected onto a target. In phase shift lithography, the phase of an exposure light at the object is controlled such that adjacent bright areas are formed preferably 180° out of phase with one another. Dark regions are thus produced between the bright areas by destructive interference even when diffraction would otherwise cause these areas to be lit. This technique improves total resolution at the object and allows resolutions as fine as 0.25 $\mu$m to occur.

An early patent in this field, U.S. Pat. No. 4,360,586 to Flanders et al, was issued on Nov. 23, 1982 and assigned to MIT. This patent was directed to exposing periodic optical features on an object surface. The features were characterized by a spatial period p. According to the invention, a source of radiant energy of wavelength $\lambda$ illuminates a surface to be exposed through a mask having a spatial period separated from the surface by a distance approximately $S_n = p^2/n\lambda$, where n is an integer greater than one.

With respect to semiconductor fabrication numerous laboratory techniques have been proposed to employ phase shifting in the photopatterning of semiconductor wafers. Most of the work in this area has centered around either "Alternating Phase Shifting", "Subresolution Phase Shifting", or "Rim Phase Shifting" experiments In general, in each of these techniques a phase shift mask or reticle is constructed in repetitive patterns of three distinct layers of material. An opaque layer on the mask provides areas that allow no light transmission therethrough, a transparent layer provides areas which allow close to 100% of light to pass through and a phase shifter layer provides areas which allow close to 100% of light to pass through but phase shifted 180° from the light passing through the transparent areas. The transparent areas and phase shifting areas are situated such that light rays diffracted through each area is canceled out in a darkened area therebetween. This creates the pattern of dark and bright areas which can be used to clearly delineate features of a pattern on a photopatterned wafer.

"Alternating Phase Shifting" as disclosed in [1] is a spatial frequency reduction concept similar to the method disclosed in the Flanders et al patent. It is characterized by a pattern of features alternately covered by a phase shifting layer. "Subresolution Phase Shifting" [2] promotes edge intensity cut off by placing a subresolution feature adjacent to a primary image and covering it with a phase shifting layer. "Rim Phase Shifting" [3] overhangs a phase shifter over a chrome mask pattern.

In general, these phase shifting techniques have not been adapted to large scale semiconductor manufacturing processes. One problem with applying phase shifting lithography into practical use, in manufacturing semiconductors, is the difficulty in reticle mask making, inspection, and repair. The process must be compatible with manufacturing conditions, (i.e. inexpensive, repetitive, clean) and prior art laboratory techniques have not heretofore met these criteria.

A representative state of the art semiconductor laboratory process for making a phase shift mask or reticle is disclosed in reference [4]. This process was also generally disclosed in the Flanders et al patent. This process is shown in FIGS. 1A–1C and is termed a "lift off process".

The "lift off process" may be used to fabricate a reticle on hard copy of an individual drawing for a semiconductor circuit layout. The reticle may then be used directly as a mask in the photopatterning process or may be used to produce a photomask. As an example, this reticle may be used to pattern a wafer surface in a stepped pattern transfer. DRAM's and SRAM's because of their repetitive nature are adapted to manufacture in this manner.

Referring to FIG. 1A, with the "lift off process" a transparent quartz substrate 10 has a film of an opaque material such as chromium (CR) patterned thereon. The chromium (CR) may be deposited and patterned onto the substrate 10 by a conventional process such as electron beam deposition and photolithography. In the example of FIG. 1A, the pattern is a periodic arrangement of chromium (CR) light blockers 12 and spaces 14 patterned on the quartz substrate 10.

A layer of resist 16 is then deposited and patterned over the patterned chromium (CR) light blockers 12 and spaces 14. Every other space 14 is covered with resist 16 such that an alternating pattern of phase shifters and openings will be ultimately formed. As shown in FIG. 1B the resist 16 is patterned in a straight wall profiles such that a subsequent etching process aids the "lift off" step.

With reference to FIG. 1B, after deposition of the resist 16, a film of phase shifter material such as ($SiO_2$) is blanket deposited over the photoresist 16 and patterned openings 14. The phase shift ultimately obtained is a function of the thickness "T" and refractive index of this phase shifter material, which are preferably selected to provide a 180° phase shift.

As shown in FIG. 1(C) the phase shifter material ($SiO_2$) is then "lifted off" with the remaining layer of photoresist 16 by stripping or etching away the photoresist 16. This leaves a phase shifter 18 in every other opening 14 between the chromium (CR) light blockers 12. This provides an alternating phase shifting pattern as previously explained.

A problem with this "lift off process" is that it is a defect prone, inconsistent, messy procedure not suitable for large scale manufacturing. Large chunks of (SiO₂) material are lifted by the etching process and are difficult to remove from the finished reticle. These contaminants may cause subsequent patterning errors of the finished wafer. Another problem with the "lift off process" is that it is difficult to accurately control the thickness of the phase shifters 18.

In the finished reticle each phase shifter 18 preferably has a thickness "T" (FIG. 1C) that produces a 180° phase shift for light passing therethrough. This optimal thickness can be determined by the formula $$T = \frac{i\lambda}{2(n-1)}$$

where

T = thickness of phase shift material
i = an odd integer
λ = wavelength of exposure light
n = refractive index of phase shifter material at the exposure wavelength Any deviation from this optimal thickness adversely affects the phase shift ultimately obtained. An "edge effect" may occur, for example, at the edge of a phase shifter 18 deposited over the edge of a chromium (CR) light blocker 12. This may be due to the conformal deposition of the phase shifter material over the chromium (CR) light blocker 12 which causes the phase shifter to be slightly thicker at the edges.

Another prior art method for forming a phase shift reticle is shown in FIGS. 2A-2C. As before, a pattern of opaque light blockers 20 such as chromium (CR) is formed on a quartz substrate 22. As shown in FIG. 2B, photoresist 24 is then patterned on the chromium light blockers 20 in every other opening 25. As shown in FIG. 2C openings 26 not covered with photoresist are then etched to form phase shifter openings 28 etched back to a depth "d" into the substrate 22. Light passing through an etched back phase shifter opening 28 is phase shifted relative to light passing through an adjacent transmission opening 30, which must travel through the full thickness of the quartz substrate.

This prior art reticle fabrication method is also subject to several disadvantages. Firstly, the etch depth "d" into the quartz 22 requires a highly controlled, uniform etch over a relatively large (example—5") reticle surface. Since it is necessary to phase shift within a margin of ±10° or less this translates to an etch tolerance of about 5%. This is difficult to achieve under manufacturing conditions.

Further the prior art etch back technique shown in FIGS. 2A-2C causes a finite loss in light transmission due to the roughness of the exterior surface of the etched back phase shifter openings 28. Another disadvantage of this etch back technique is the difficult requirement of having to accurately pattern photoresist 24 over the topology of the opaque light blockers 20.

The process of the present invention is directed to a novel process that overcomes these prior art limitations. The process of the invention provides a clean, repetitive, technique for forming accurate phase shifting reticles suitable for large scale semiconductor manufacturing. Moreover, the process of the invention can be used to provide phase shifters having a smooth and optically flawless surface.

SUMMARY OF THE INVENTION

In accordance with the present invention a novel method of fabricating phase shifting reticles or masks for semiconductor photolithography is provided. The method of the invention, simply stated, utilizes ion implantation to change the index of refraction of an area of the transparent substrate to form phase shifters. Each ion implanted phase shifter has an index of refraction selected to diffract light 180° out of phase from light diffracted through adjacent light transmission openings that are formed in an opaque film deposited on the transparent substrate. A photolithographic process is used to form opaque light blockers on either side of each ion implant phase shifter and on either side of each light transmission opening to form a repetitive alternating pattern on the finished reticle of phase shifters and light transmission openings.

The method of the invention for forming a phase shifting reticle, in general, includes the steps of:

forming a pattern of ion implant areas on a transparent quartz substrate in order to change the index of refraction of the quartz substrate to form phase shifters in these areas; and forming openings and opaque light blockers on the quartz substrate in an alternating pattern that provides opaque light blockers on either side of the phase shifters on either side of light transmission openings.

In use as a reticle, during photopatterning of a wafer, incident light is directed through the quartz substrate. Light passing through a phase shifter is diffracted in an opposite (180°) optical phase from light passing through an adjacent light transmission opening. This phase canceling produces a dark region, formed on the target object (wafer), between the phase shifter and the adjacent light transmission opening.

Numerous other features, objects, and advantages of the invention will become apparent from the following specification when read in connection with the accompanying drawing in which:

BRIEF DESCRIPTION OF THE DRAWING

FIGS. 3A-3E are diagrammatic representations of the steps involved in fabricating a phase shift reticle in accordance with the invention, FIG. 4 is a diagrammatic representation of a phase shift reticle fabricated in accordance with the invention in use during phase shift photolithography of a semiconductor wafer; and FIG. 5 is a diagrammatic representation showing the composition of light waves diffracted from a light transmission opening and adjacent phase shifters on a reticle fabricated in accordance with the invention and the resulting amplitude and intensity of light waves at a target wafer.

DETAILED DESCRIPTION OF PREFERRED EMBODIMENTS

Figure 1A:
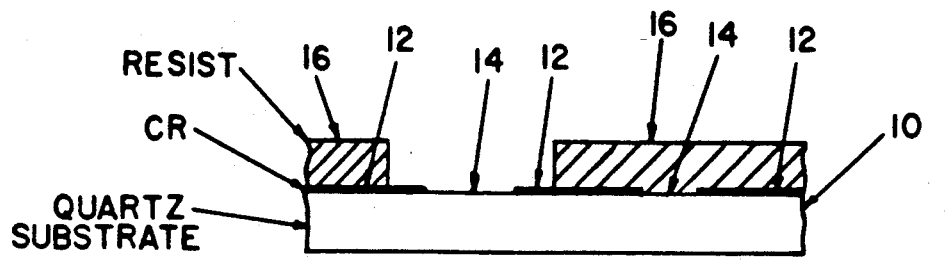
FIGS. 1A-1C are diagrammatic representations of the involved in a prior art "lift off" process for forming a phase shift reticle.
Figure 1B:
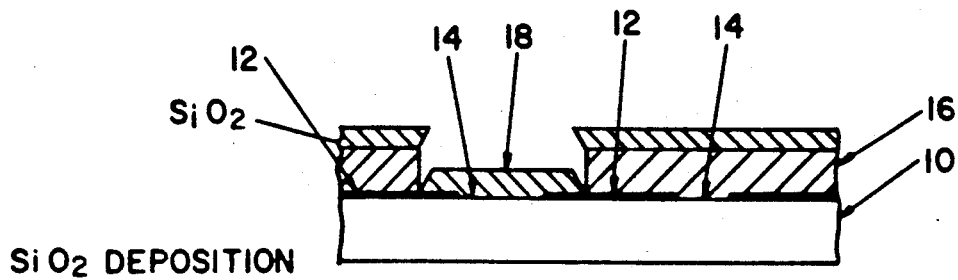
Figure 1C:
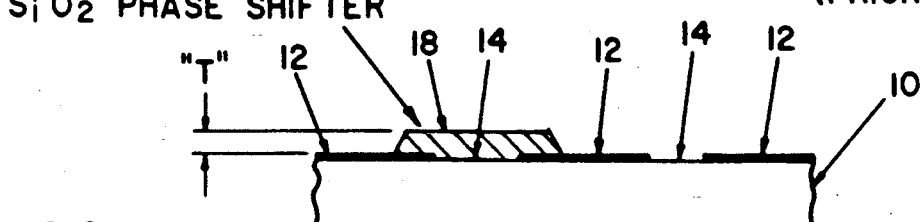
Figure 2A:
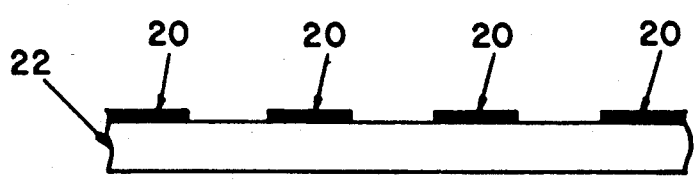
FIGS. 2A-2C are diagrammatic representations of the steps involved in fabricating a phase shift reticle in accordance with a prior art etch back process.
Figure 2B:
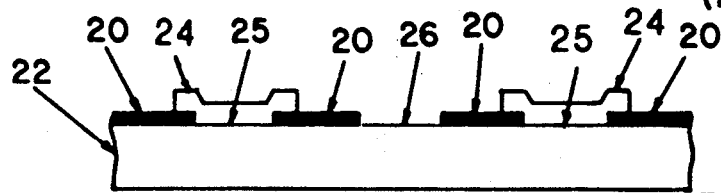
Figure 2C:
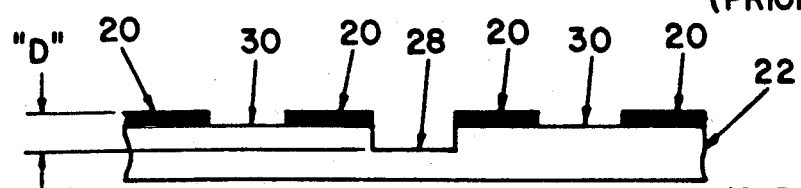

As used herein the terms reticle and mask are interchangeable. Additionally, the disclosure refers to various materials which are electrically either conductive, insulating, or semiconducting; although the completed semiconductor circuit device itself is usually referred to as a "semiconductor".

Referring to FIGS. 3A–3E a method of fabricating a phase shift reticle in accordance with the invention is shown.

The method of the invention includes the steps of:

coating and patterning a first layer of photoresist on a transparent quartz substrate by a first photolithographic process (FIG. 3A);

ion implanting areas of the substrate with a dopant in order to change the index of refraction of the quartz substrate to form phase shifters, (FIG. 3B);

stripping the first layer of photoresist and depositing an opaque film on the transparent substrate, (FIG. 3C);

coating and patterning a second layer of photoresist on the opaque film by a second photolithographic process to form light transmission areas and light blockers in a repetitive pattern of alternating phase shifters and light transmission areas with light blockers on either side of each phase shifter and on either side of each light transmission area, (FIG. 3D); and stripping the photoresist to form the finished reticle, (FIG. 3E).

Referring now to FIG. 3A, a phase shift reticle fabricated in accordance with the invention is formed on a transparent substrate 32. In an illustrative embodiment of the invention the transparent substrate 32 is quartz (QZ). Quartz is a highly purified glass favored for its optical properties, inherent stability at high temperatures and its cleanliness. Quartz is typically utilized as the mask substrate material in optical projection systems and is highly transparent in the deep UV region. Alternately, the transparent substrate 32 may be formed of any other transparent material having suitable optical and mechanical properties.

As shown in FIG. 3A, a photosensitive resist layer 34 is coated and patterned onto the substrate 32 by a first photolithographic step. The resist layer 34 may be coated and patterned onto the substrate 32 by techniques known in the art, such as by E-beam writing or laser pattern writing. In the illustrative embodiment the resist 34 is patterned with openings 35.

Next and as shown in FIG. 3B, the substrate 32 is subjected to high voltage ion bombardment with ion dopants. This forms ion implant areas in the substrate, which, as will hereinafter be explained, function as phase shifters 36. These ion implant areas (phase shifters 36) are characterized by an index of refraction that is different than the index of refraction of the remaining quartz substrate 32. Preferably this relative difference in the index of refraction provides a phase shift of 180° between light passing through a phase shifter 36 and light passing through any other portion of the transparent quartz substrate 32.

Ion implantation processes are well known in the art of semiconductor manufacturing. In general, ion implantation forms a specific concentration and distribution of dopant atoms in the quartz substrate 32. This alters the chemical structure and physical characteristics of the substrate 32 in the ion implant area. In the present case the objective is to provide a dopant concentration and distribution that achieves a change in the index of refraction of the quartz substrate 32 to provide a 180° phase shift at the exposure wavelength. (The exposure wavelength may, for example, be at a wavelength of about 248 nm for KrF excimer laser lithography. Photolithography may also be performed in the range of the UV i-line (365 nm) or the UV g-line (436 nm) which are also common wavelengths used in photolithography processes.)

The change in the refractive index may be achieved by closely controlling the ion implantation process by techniques that are known in the art. The implantation may be performed on suitable ion implantation equipment used in the semiconductor manufacturing art such as with an electrostatic beam scanning apparatus. The dopant ions may be any suitable ions such as for example suitable species of Boron and Phosphorus.

The patterned resist 34 acts as a barrier to the ion beam so that only areas on the substrate adjacent to the openings 35 (FIG. 3A) through the resist 34 are implanted. Alternately, films other than resist which are employed in semiconductor manufacturing can also be used to block the ion beam. After the ion implantation is completed the resist 34 is stripped from the substrate. The smooth surface of the quartz substrate FIG. 3B is not degraded by the process such that the surface and optical properties of the phase shifters 36 are essentially the same as the quartz.

Next and as shown in FIG. 3C, an opaque film 38 is blanket deposited upon the quartz substrate 32. The opaque film 38 may be deposited onto the substrate 32 by conventional processes such as sputtering, chemical-vapor deposition (CVD), or electron beam deposition (EBD). In the illustrative embodiment, the opaque film 38 material is chromium (CR), which is typically utilized in such applications. Chromium (CR) is characterized by mechanical properties suitable for plating and is more than 90% opaque to wavelengths in the UV and deep UV region. Other opaque films however, such as iron oxide and aluminum would also be suitable for the application.

Next and as shown in FIG. 3D a second photolithographic process is performed and a second photosensitive layer of photo resist 40 is coated and patterned onto the opaque film 38. As before with the first photolithographic process step, (FIG. 3A) patterning may be by techniques known in the art, such as with E-beam writing or laser pattern writing. An etch and strip step may then be used to form a pattern of openings through the opaque film 38 to the substrate 32. These openings are formed onto the phase shifters 36 previously formed and onto an area between phase shifters 36 that will become a light transmission opening.

As shown in FIG. 3E, this forms an alternating pattern of light transmission openings 42 and ion implant phase shifters 36. Opaque light blocker sections 44 are located on either side of each ion implant phase shifter 36 and on either side of each light transmission opening 42. This repetitive pattern can be described as a light blocker section 44, a phase shifter 36, a light blocker section 44, and a light transmission opening 42 This is the completed reticle 46. The width of the opaque light blocker sections 44, phase shifters 36, and light transmission openings 42 may be selected as required.

Referring now to FIG. 4 a phase shift reticle 46 formed by the method of the invention is shown in use in a photolithographic process for photopatterning a semiconductor wafer 48. The phase shift reticle 46 is situated between the incoming incident light (i.e. KrF laser) and a wafer 48 to be processed. A reduction lens 50 is located between the phase shift reticle 46 and wafer 48. In the illustrative embodiment the reduction lens 50 is a 5× reduction system. Alternately, other reduction systems such as 10×, 4×, or 1× may be utilized.

In the illustration of FIG. 4 a step and repeat system is utilized. In this system the wafer 48 is stepped under the lens 50 to expose the pattern in sections over the entire surface of the wafer 48. This is a typical application for a reticle 46 or mask formed in accordance with the invention although other applications may also be possible including photopatterning of items other than semiconductor wafers.

Referring now to FIG. 5 an analysis of the composition of light waves diffracted from a light transmission opening 42 and adjacent phase shifters 36 on either side of the light transmission opening 42 is shown. Graph 1 denotes the amplitude and phase of phase shifted light (180°) passed through a first phase shifter 36 onto area 36' on the target wafer 48. Graph 2 denotes the amplitude and phase of incident light (no phase shift) passing through the light transmission opening 42 onto area 42' on the target wafer 48. Graph 3 denotes the amplitude and phase of phase shifted light (180°) passed through the phase shifter 36 on the other side of the light transmission opening 42. Graph 4 denotes the combined amplitude of the three light rays as seen at the object wafer 48. Graph 5 denotes the intensity of the light at the object wafer 48. These graphs are for illustrative purposes only.

As seen in graphs 1, 2, and 3 a light wave diffracted from either a phase shifter 36, or a light transmission opening 42 of the reticle is naturally diffracted into areas 44' therebetween, on the target wafer 48, in an area aligned with the light blocker sections 44 on the reticle 46. As shown in graph 4, the combination of the three separate diffracted rays (graphs 1, 2, 3) in the areas 44' substantially cancel each other out so that these areas 44' are dark with clear cut boundaries. As shown in graph 5 this produces areas of approximately zero light intensity or dark areas on the wafer 48. These dark areas 44' occur where diffracted light from the light transmission opening 42 would otherwise light the area. The resolution and depth of features on the reticle is thus improved by the clearly delineated dark and light areas.

Thus the invention provides a simple yet unobvious method of fabricating phase shift masks or reticles adapted for use in semiconductor photolithographic processes. The ion implantation step of the invention can be accurately controlled to achieve a 180° phase shift in each of the phase shifters 36. Moreover, there is no edge effect caused by an uneven phase shifter thickness, and each phase shifter may be formed with a smooth optically perfect surface. Additionally, the process is clean and can be economically accomplished using equipment and techniques that are known in the art.

In the illustrative embodiment of the invention, the reticle included a simple pattern of lines and spaces. The method of invention, however, can be used to fabricate reticles in other patterns including, for example, wiring patterns, word lines, bit lines, hole patterns, and black patterns.

While the process of the invention has been described with reference to a preferred embodiment thereof, as will be apparent to those skilled in the art, certain changes and modifications can be made without departing from the scope of the invention as defined by the following claims.

REFERENCES

[1] M. D. Levenson, D. S. Goodman, S. Lindsey, P. W. Barjer and H. A. E. Santini, "The Phase-Shifting Mask II: Imaging Simulations and Submicrometer Resist Exposures" IEEE Transactions on Electronic Devices, Vol. ED-31, No. 6, June 1984.

[2] T. Yamanaka, N. Hasegawa, T. Tanaka, K. Ishibashi, T. Hashimoto, A. Shimizu, N. Hashimoto, K. Sasaki, T. Nishida, and E. Takeda, "A 5.9 $\mu m^2$ Super Low Power SRAM Cell Using A New Phase Shift Lithography" IEDM Tech. Dig. pp. 477–480, 1990.

[3] A. Nitayama, T. Sato, K. Hashimoto, F. Shigemitsu, and M. Nakase, "New Phase Shifting Mask with Self-Aligned Phase Shifters for a Quarter Micron Photolithography" IEDM Tech. Dig. pp. 57–60, 1989.

[4] I. Hanyu, S. Asai, K. Kosemura, H. Ito, M. Nunokawa and M. Abe, "New Phase-Shifting Mask With Highly Transparent $SiO_2$ Phase Shifters" SPIE Vol. 1264 Optical/Laser Microlithography 111, P. 167–177, 1990.

What is claimed is:

1. A method of forming a phase shifting reticle comprising:
   forming a pattern of ion implant areas on a transparent substrate by ion bombardment of the substrate with an ion dopant selected to change an index of refraction of the substrate to produce a phase of light and form a phase shifter in each ion impact area;
   depositing an opaque film on the transparent substrate; and
   forming openings through the opaque film to the substrate in a repetitive pattern to form a pattern of opaque light blockers with the opaque light blockers self aligned with the ion implant phase shifters and with light transmission openings so that light passed through an ion implant phase shifter is shifted out of phase with light passed through a light transmission opening.

2. The method as recited in claim 1 and wherein: the phase shifters are ion implanted with an ion dopant to change the index of refraction of the substrate in the ion implant areas to achieve a 180° phase shift.

3. The method as recited in claim 1 and wherein: ion implantation is by ion bombardment with electrostatic beam scanning.

4. The method as recited in claim 1 and wherein: forming a pattern of ion implant areas is by a first photolithographic process in which the substrate is coated with a patterned resist having openings for forming phase shifters on the substrate.

5. The method as recited in claim 1 and wherein: forming a pattern of light transmission openings in the opaque film is by a second photolithographic process in which the opaque film is patterned with a resist, etched to form the light transmission openings and the resist is stripped.

6. The method as recited in claim 1 and wherein: the ion dopant is a species of boron.

7. The method as recited in claim 1 and wherein: the ion dopant is a species of phosphorous.

8. A method of forming a phase shifting reticle for use in semiconductor photolithography comprising:

coating a patterned film layer on a transparent substrate to form blocks to an ion beam and to form openings to the substrate;

ion bombarding the substrate such that ion implant areas are formed on the substrate adjacent to the openings phase shifters having an index of refraction different than an index of refraction of the substrate to produce a phase shift of light;

depositing an opaque film over the substrate and ion implant areas to define an image;

coating a layer of photoresist over the opaque film, patterning the layer of photoresist with openings, with an opening located on each phase shifter and in an area between each phase shifter; and etching the opaque film to form light transmission openings through the opaque film to the substrate in an alternating repetitive pattern of self aligned phase shifters and light transmission openings having opaque light blockers on either side with each opaque light blocker located partially over a phase shifter and partially over a light transmission openings.

9. The method as recited in claim 8 and wherein:
the reticle is formed with a repetitive pattern including an opaque light blocker, a phase shifter, an opaque light blocker and a light transmission opening.

10. The method as recited in claim 9 and wherein:
the ion implant phase shifters are implanted with a dopant selected and concentrated to change the index of refraction of the substrate to provide a 180° phase shift.

11. The method as recited in claim 10 and wherein:
the substrate is quartz (QZ).

12. A method of forming a phase shifting reticle for use in semiconductor photolithography comprising:
coating a layer of photoresist onto a quartz (QZ) substrate and patterning the resist by a first photolithographic process to form openings through the resist to the substrate;

ion implanting a selected ion dopant in the openings by means of high voltage ion bombardment to form ion implant phase shifters on the substrate with the phase shifters having an index of refraction different than an index of refraction of the quartz substrate to produce a phase shift of light;

depositing an opaque film over the substrate;

forming openings through the opaque film by a second photolithographic process in a repetitive pattern with each opening located partially over a phase shifter and partially over an area between each phase shifter to form a self aligning repetitive pattern of an opaque light blocker, a light transmission opening, an opaque light blocker, and an ion implanted phase shifter.

13. The method as recited in claim 12 and wherein:
ion implanting is controlled to achieve phase shift areas having an index of refraction that produces a 180° phase shift relative to light passed through the quartz substrate.

14. The method as recited in claim 13 and wherein:
the ion dopant is selected from a class consisting of a species of boron or phosphorous.

15. The method as recited in claim 14 and further comprising:
directing an incident light through the phase shift reticle onto a target wafer in a photolithography process to produce alternating dark areas by diffraction of light waves between a light transmission opening and an ion implant phase shifter in order to improve the resolution and depth of field of the photolithography process.

16. The method as recited in claim 15 and wherein:
a reduction lens is placed between the reticle and a wafer to be photopatterned.

17. The method as recited in claim 16 and wherein:
the wafer is stepped under the lens to expose the reticle pattern over the entire wafer surface.

18. A method of forming a phase shifting reticle for semiconductor manufacture, comprising:
coating a transparent substrate with an ion block material;

patterning the ion block material with openings;

ion bombarding through the openings, to the substrate to form ion implant areas in the substrate as phase shifters having an index of refraction different than an index of refraction of the transparent substrate with the ion bombarding controlled to achieve a predetermined phase shift of light;

stripping the ion block;

depositing an opaque film on the substrate and over the phase shifters;

patterning the photoresist with opening with an opening over each phase shifter and an opening between each phase shifter;

etching the opaque film through the openings to form openings through the opaque film to the phase shifters and to an area between each phase shifter such that an alternating pattern is formed of light transmission openings having opaque light blockers on either side alternating with self aligned phase shifters having opaque light blockers on either side;

stripping the photo resist such that an opaque light blocker, a light transmission opening, an opaque light blocker, and a phase shifter are formed in a repetitive pattern;

whereby incident light directed through a phase shifter is shifted 180° out of phase from light directed through an adjacent light transmission opening to produce a destructive interference for improving a resolution of an image defined by an opaque light blocker.

19. The method as recited in claim 18 and wherein:
the substrate is quartz;
the opaque layer is chromium; and
the ion dopant is selected from the group consisting of a species of boron or phosphorus.

20. A method of forming a phase shifting reticle comprising:
forming a first pattern of ion implant areas on a transparent substrate by ion bombardment of the substrate with an ion dopant selected to change an index of refraction of the substrate to form phase shifters for producing a phase shift of light;

forming a second pattern of opaque light blockers on the transparent substrate with the opaque light blockers defining a predetermined image; and forming a third pattern of light transmission areas on the substrate with the first, second and third patterns self aligned such that light passed through the phase shifters is phase shifted relative to light passed through the light transmission areas for improving the image defined by the opaque light blockers during photopatterning.

* * * * *